United States Patent
Aoki et al.

(10) Patent No.: US 7,438,580 B1
(45) Date of Patent: Oct. 21, 2008

(54) INTERMEDIATE LOAD MECHANISM FOR A SEMICONDUCTOR PACKAGE

(75) Inventors: Russell Aoki, Tacoma, WA (US); Tod A. Byquist, Federal Way, WA (US); Konomi Shimada, University Place, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/903,027

(22) Filed: Sep. 20, 2007

(51) Int. Cl.
*H01R 13/62* (2006.01)

(52) U.S. Cl. ........................ 439/331; 439/342

(58) Field of Classification Search .............. 439/330, 439/331, 342, 73
See application file for complete search history.

(56) References Cited

U.S. PATENT DOCUMENTS

| | | | |
|---|---|---|---|
| 6,969,267 B2 | 11/2005 | Byquist | 439/73 |
| 7,033,198 B2 * | 4/2006 | Chiang | 439/331 |
| 7,247,043 B2 * | 7/2007 | Lai | 439/331 |
| 7,291,022 B2 * | 11/2007 | Toda et al. | 439/73 |
| 7,351,087 B2 * | 4/2008 | Szu | 439/342 |
| 2003/0166355 A1 * | 9/2003 | Simons et al. | 439/331 |
| 2006/0057878 A1 * | 3/2006 | Szu | 439/331 |
| 2006/0128201 A1 * | 6/2006 | Ju | 439/331 |
| 2006/0141840 A1 * | 6/2006 | Ma | 439/331 |
| 2007/0155215 A1 * | 7/2007 | Hsu | 439/331 |
| 2007/0281534 A1 * | 12/2007 | Xu et al. | 439/331 |
| 2008/0045048 A1 * | 2/2008 | Ma | 439/73 |
| 2008/0081489 A1 * | 4/2008 | MacGregor et al. | 439/71 |
| 2008/0153338 A1 * | 6/2008 | Ju | 439/331 |

OTHER PUBLICATIONS

U.S. Appl. No. 11/541,714, filed Sep. 29, 2006, entitled "Reliable Land Grid Array Socket Loading Device," by Mike G. MacGregor, et al.

* cited by examiner

*Primary Examiner*—Ross N Gushi
(74) *Attorney, Agent, or Firm*—Trop, Pruner & Hu, P.C.

(57) ABSTRACT

In one embodiment, the present invention includes a load frame to be affixed to a primary surface of a circuit board adjacent to a socket, a load plate having a proximal portion rotatably adapted to the load frame and a distal portion having a tongue member to be locked by a shoulder member adapted to the circuit board on a side of the socket opposite to the frame, and a load lever to mate the load plate to the load frame, where the load lever is rotatable from an open position to an engaged position to lock the tongue member of the load plate under a head of the shoulder member. Other embodiments are described and claimed.

13 Claims, 4 Drawing Sheets

INTERMEDIATE LOAD MECHANISM FOR A SEMICONDUCTOR PACKAGE

BACKGROUND

Central processing units and similar integrated circuits communicate with other components of a computer system over a printed circuit board that is typically referred to as a mainboard or motherboard. Central processing units and similar processors are often coupled to the mainboard through a socket. The socket serves as an interface for the mainboard and central processing units. The socket aligns the interconnects of the central processing unit and the mainboard. The socket is coupled with a socket loading mechanism that electrically connects the central processing unit to the mainboard.

Typically, each socket has a loading mechanism designed especially for it, as variances in size, positioning, loading force and so forth require such specialized loading mechanisms. Furthermore, typical loading mechanisms can have a number of different parts, which raises the cost of developing and manufacturing these mechanisms, as well as attendant complexity during high volume manufacturing of computer systems including such sockets.

DETAILED DESCRIPTION

In various embodiments, an intermediate load mechanism (ILM) is used to apply a preload on a processor to a socket. This preload is used to ensure electrical contact between the socket contacts and the processor package. Some embodiments may include four major components, namely, a load plate, a load lever, a frame and a backing plate. The load lever is the component to which a user applies a finger load to actuate movement into the load plate and eventually apply a resulting preload to the processor package, and more particularly to an integrated heat spreader (IHS), where present. Due to the design of both the lever and load plate there is a mechanical advantage that is produced, minimizing the load applied by the user and maximizing the resulting preload onto the processor IHS via the load plate. The frame is a piece of structure that assembles the load lever to the motherboard surface or other circuit board to which the retention mechanism is attached. In one embodiment, a plurality of screws or other such fasteners are used to fasten the frame to the backside stiffening plate through the circuit board. In turn, the backside stiffening plate is used to control the local warpage of the motherboard under the socket and provide solderball joints protection for dynamic and environmental effects.

Embodiments may enable a user to open and close the load plate to give access to the socket and to provide a preload, as mentioned above. The nature of the mechanism allows for a greater package thickness variation due to the kinematics of the design. This will allow for a larger number of processors (i.e., of varying different sizes) to be used with this load mechanism, which reduces assembly factory cost to limit dimensional shifting of the integrated heat spreader. The mechanism also allows a single actuation for opening/closing the load plate and applying the load. That is, the user only needs to interface with the load lever in a single movement to operate the mechanism. This further enables improved assembly feed rate during circuit board manufacture, such as during test operations.

Figure 1:
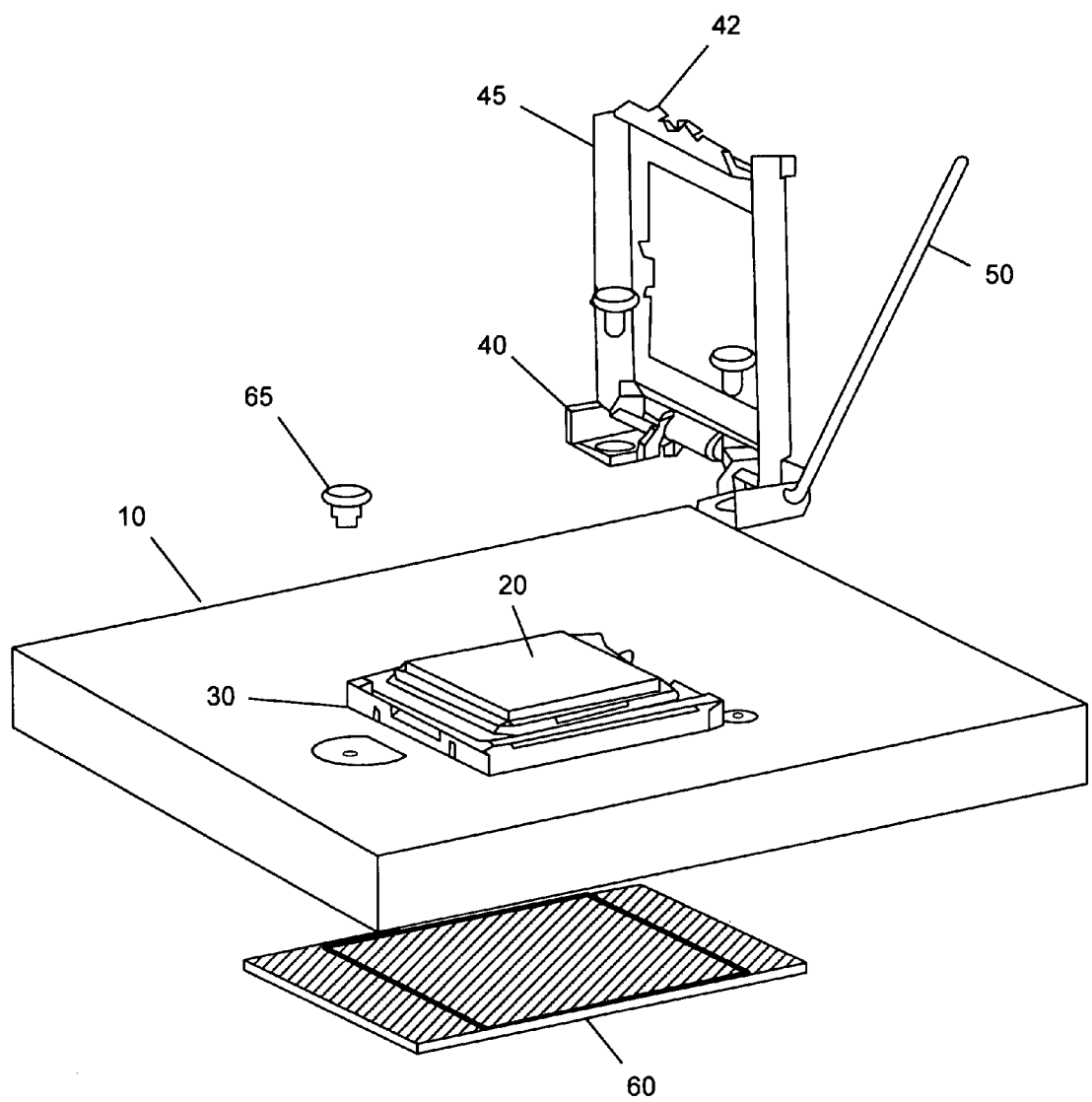
FIG. 1 is a perspective view of an assembly in accordance with one embodiment of the present invention.

Referring now to FIG. 1, shown is a perspective view of an assembly in accordance with one embodiment of the present invention. More specifically, as shown in FIG. 1, an intermediate load mechanism may be provided in connection with a processor package 20 coupled to a motherboard or other circuit board 10 via a socket 30. In one embodiment, processor package 20 may include a package substrate to which is coupled to a processor die, over which is adapted an IHS. As shown in FIG. 1, the ILM includes a frame 40. As will be described further below, frame 40 may be adapted to a primary surface of motherboard 10 by fasteners such as a pair of screws. Note that frame 40 is only adapted to be adjacent to a single side of a socket, rather than extending peripherally about the entire socket, reducing cost and footprint, minimizing an amount of board real estate consumed, as well as the number of fasteners needed to adapt it to circuit board 10. In turn, a load plate 45 is adapted to frame 40 and is actuated by a load lever 50. To enable support of the load generated by the ILM, a backing plate 60 may be provided on a secondary surface of motherboard 10. Backing plate 60 may be retained using the fasteners that couple frame 40 to motherboard 10. Still further, a shoulder screw 65 may be adapted on a side of socket 30 distal to frame 40. As will be described further below, shoulder screw 65 may aid in mating and retaining load plate 45 in its retention position using a tongue 42 of load plate 45. While shown with this particular implementation in the embodiment of FIG. 1, the scope of the present invention is not limited in this regard.

To assemble the ILM to circuit board 10, first backing plate 60 may be adapted to the secondary surface of circuit board 10. Shoulder screw 65 may be fastened in place to secure backing plate 60 to circuit board 10. Then load plate 45 and load lever 50 may be assembled to frame 40, as load lever 50 acts to mate load plate 45 to frame 40. Finally, the combined subassembly including load plate 45, load lever 50 and frame 40 may be installed onto circuit board 10, e.g., using a pair of screws that further secure to backing plate 60.

Figure 2:
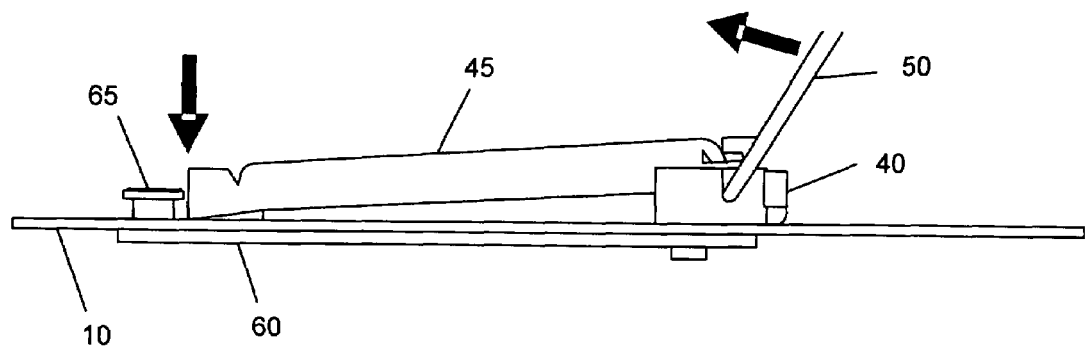
FIG. 2 is a side view of partial actuation of an intermediate load mechanism in accordance with an embodiment of the present invention.

After adaptation of an ILM to a circuit board in accordance with an embodiment of the present invention, the ILM may be actuated to allow it to retain a processor package to its socket. Referring now to FIG. 2, shown is a side view of a partial actuation of an intermediate load mechanism in accordance with an embodiment of the present invention. As shown in FIG. 2, load lever 50 is partially actuated. A user may rotate load lever 50 in a counter clockwise manner. In so doing, load plate 45 touches the primary surface of circuit board 10 as its distal portion (with respect to frame 40) rotates in a downward manner. By the continual actuation of load lever 50, the distal portion of load plate 45 clears the head of shoulder screw 65, as shown in FIG. 2. As the user continues to rotate load lever 50, it causes load plate 45 to then primarily translate in a horizontal direction (i.e., right to left in FIG. 2) with some vertical translation. Tongue 42 of load plate 45 translates under the head of shoulder screw 65. Note that tongue 42 may still touch the primary surface of circuit board 10.

Figure 3A:
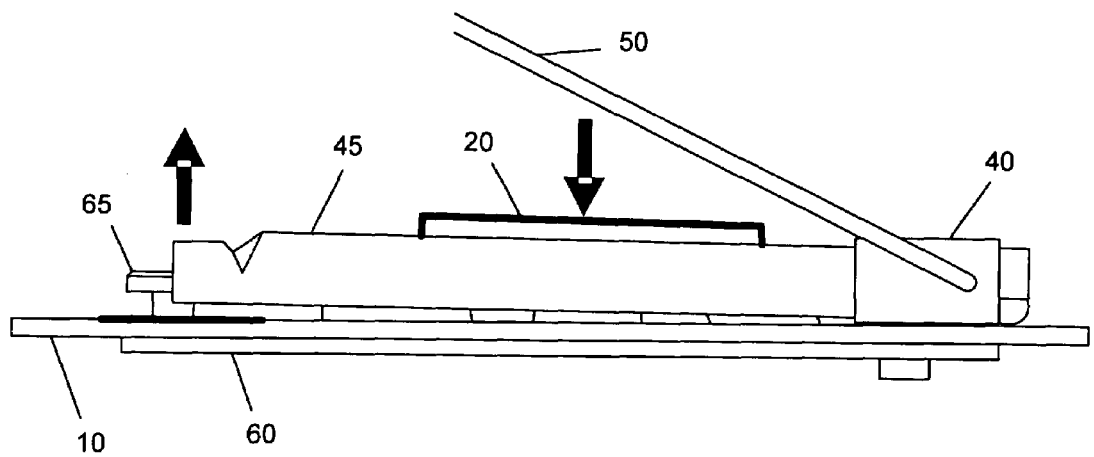
FIG. 3A is a side view of further actuation of an intermediate load mechanism in accordance with an embodiment of the present invention.

Referring now to FIG. 3A, shown is a side view of further actuation of an intermediate load mechanism in accordance with an embodiment of the present invention. As shown in FIG. 3A, the rotation of load lever 50 now causes primarily a vertical translation of load plate 45. When load plate 45 touches the surface of processor package 20 (and more specifically an IHS of the package where present), the distal portion of load plate 45 is caused to lift up off the primary surface of circuit board 10. In this way, tongue 42 (not shown in FIGS. 2 and 3A) contacts the head of shoulder screw 65. A user may continue to rotate load lever 50 to a final position (e.g., at a horizontal level) with respect to FIG. 3A to apply an appropriate preload value. While the scope of the present invention is not limited in this regard, the preload compression may be between approximately 350 and 650 Newtons.

Figure 3B:
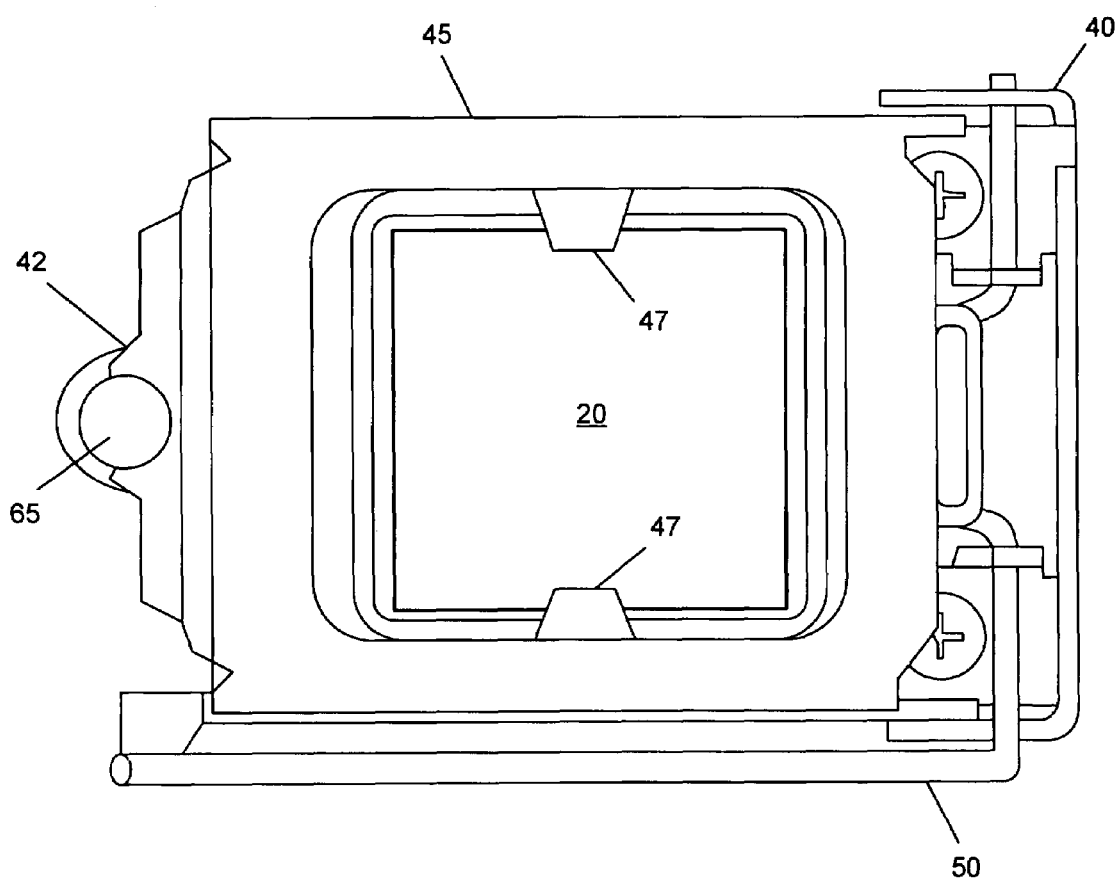
FIG. 3B is a top view of a fully loaded intermediate load mechanism in accordance with an embodiment of the present invention.

FIG. 3B, which is a top view of a fully loaded intermediate load mechanism in accordance with an embodiment of the present invention, shows that load lever 50 hooks into load plate 45 with this same rotational force (i.e., a single movement). A pair of tabs 47 on load plate 45 may center on a center line of the underlying socket. Furthermore, tongue 42 of load plate 45 interfaces the bottom of the head of shoulder screw 65. Note in the embodiment of FIG. 3B that load plate 45 may have an oversized cutout to allow for desired translation.

In various embodiments, a series of cam interfaces may be provided to enable controlled actuation of a load plate in accordance with an embodiment of the present invention. More specifically, multiple cam interfaces may be present to control the rotation of the load plate relative to the rotation of the load lever. In this way, the load plate may be prevented from an undesired slamming shut. Furthermore, such features may allow for a single motion of the load lever to open and close the load plate, via a one-handed operation.

Figure 4A:
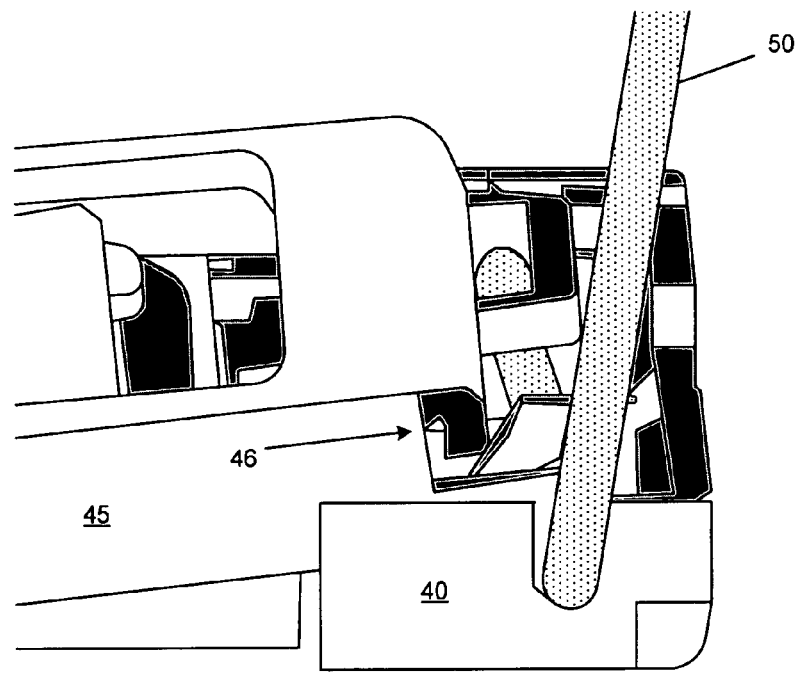
FIG. 4A is a close up view of an intermediate load mechanism in accordance with an embodiment of the present invention.
Figure 4B:
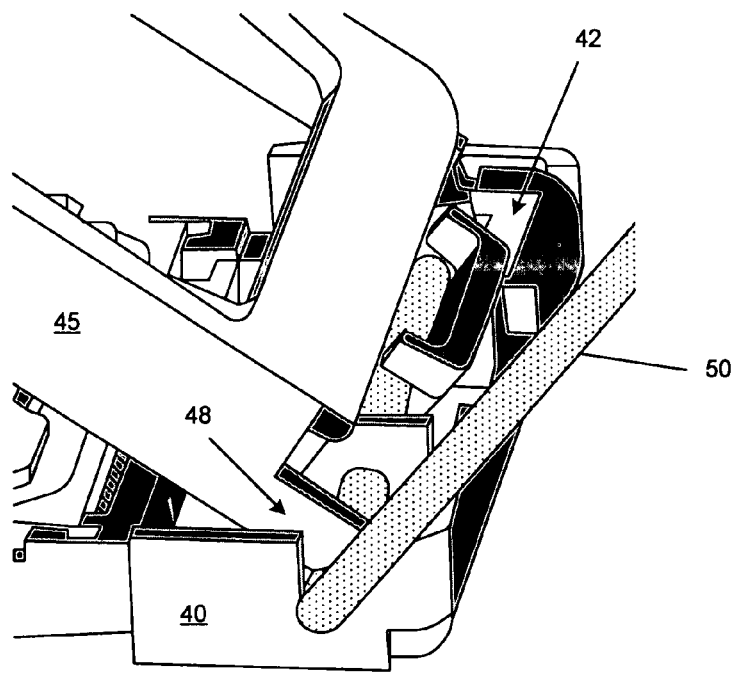
FIG. 4B is another close up view of an intermediate load mechanism in accordance with an embodiment of the present invention.

Referring now to FIGS. 4A and 4B, shown are close up views of an intermediate load mechanism in accordance with an embodiment of the present invention. As shown in FIG. 4A, load plate 45 includes a primary cam surface 46. By presence of this cam surface, after load plate 45 has completed translating, it contacts the edge of frame 40 and load plate 45 is forced to rotate upwardly. Furthermore, ears 48 present on both sides of load plate 45 may pre-align load plate 45 prior to closing around the perimeter of a socket body. Referring also to FIG. 4B, frame 40 may include a secondary cam surface 42, which may provide the same function as the primary cam surface 46 after that cam runs out of travel.

An assembly in accordance with an embodiment of the present invention may be significantly cheaper than other retention mechanisms, as a reduced number of parts and lesser material are used in the assembly. Embodiments also accommodate a larger variation of package thickness, allowing for greater adoption and flexibility for those who choose to use this assembly. Embodiments may also improve flexibility of board routing, as only three fasteners are used, particularly as one of the fasteners is located away from a socket corner. The single actuation of the mechanism is in contrast to conventional solutions that require a user to disengage the load lever, then as a second step manually open the load lever. To apply an embodiment the user need only rotate the load lever to open the load plate and access the socket. The mechanism also allows easy access to the socket and processor because the load plate rotates away from the socket, and the entire socket is exposed. The end user can thus receive visual indicators for installing the package to the socket, leading to a more robust assembly process and an improved fallout rate. With full visual indication and single step actuation, less chance of pin damage in the socket can be realized.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a load frame to be affixed to a primary surface of a circuit board by a pair of fasteners, the load frame located on a first side of a socket that is to receive a semiconductor package;
   a load plate having a proximal portion rotatably adapted to the load frame and a distal portion having a tongue member to be locked by a shoulder member adapted to the circuit board on a second side of the socket opposite the first side;
   a load lever to actuate and mate the load plate to the load frame, the load lever rotatable from an open position to an engaged position to lock the tongue member of the load plate under a head of the shoulder member; and
   a stiffener plate adapted to a secondary surface of the circuit board by the pair of fasteners and the shoulder member.

2. The apparatus of claim 1, wherein the load frame does not extend around the socket.

3. The apparatus of claim 1, wherein the load plate includes a primary cam surface on the proximal portion to cause the load plate to rotate upwardly after the distal portion of the load plate contacts the primary surface of the circuit board.

4. The apparatus of claim 3, wherein the load frame includes a secondary cam surface to cause the load plate to rotate upwardly after the primary cam surface has run out of travel.

5. The apparatus of claim 3, wherein a single rotational motion of the load lever in a first direction is to engage the load frame into the engaged position and a single rotational motion of the load lever in a second direction opposite the first direction is to disengage the load frame from the engaged position.

6. The apparatus of claim 5, wherein the load lever is to hook into the load plate in the engaged position and to unhook and return to the open position by the single rotational motion in the second direction.

7. The apparatus of claim 5, wherein the single rotational motion in the first direction is to first cause the distal portion to contact the primary surface of the circuit board adjacent to the shoulder member and to second cause the distal portion to translate horizontally and vertically to cause the tongue member to contact the head of the shoulder member.

8. A system comprising:
   a circuit board having a primary surface including a socket to receive a semiconductor package, the semiconductor package including a die coupled to a package substrate and an integrated heat spreader adapted about the semiconductor package, the primary surface of the circuit board further including a lock member adjacent to the socket on a first side thereof, the lock member to lock a retention mechanism adapted about the socket; and
   the retention mechanism including a load frame affixed to the primary surface of the circuit board by a pair of fasteners, the load frame located adjacent to the socket on only a single side thereof, a load plate having a proximal portion rotatably adapted to the load frame and a distal portion having a tongue member to be locked by the lock member on the first side of the socket opposite the single side, a load lever to actuate and mate the load plate to the load frame, the load lever rotatable from an open position to an engaged position to lock the tongue member of the load plate to the lock member, and a backside stiffener adapted to a secondary surface of the circuit board by the pair of fasteners and the lock member.

9. The system of claim 8, wherein the load plate includes a primary cam surface on the proximal portion to cause the load plate to rotate upwardly after the distal portion of the load plate contacts the primary surface of the circuit board.

10. The system of claim 9, wherein the load frame includes a secondary cam surface to cause the load plate to rotate upwardly after the primary cam surface has run out of travel.

11. The system of claim 9, wherein a single rotational motion of the load lever in a first direction is to engage the load frame into the engaged position and a single rotational motion of the load lever in a second direction opposite the first direction is to disengage the load frame from the engaged position.

12. The system of claim 11, wherein the single rotational motion in the first direction is to first cause the distal portion to contact the primary surface of the circuit board adjacent to the lock member and to second cause the distal portion to translate horizontally and vertically to cause the tongue member to contact a head of the lock member.

13. The system of claim 11, wherein the load lever is to hook into the load plate in the engaged position and to unhook and return to the open position by the single rotational motion in the second direction.

\* \* \* \* \*